(12) United States Patent
Li et al.

(10) Patent No.: US 12,177,951 B2
(45) Date of Patent: Dec. 24, 2024

(54) METHOD AND APPARATUS FOR POWER FEEDBACK LED VOLTAGE CONTROL

(71) Applicant: SCT LTD., Grand Cayman (KY)

(72) Inventors: Eric Li, Danville, CA (US); Shean-Yih Chiou, Milpitas, CA (US)

(73) Assignee: SCT LTD., Grand Cayman (KY)

( * ) Notice: Subject to any disclaimer, the term of this patent is extended or adjusted under 35 U.S.C. 154(b) by 121 days.

(21) Appl. No.: 18/169,067

(22) Filed: Feb. 14, 2023

(65) Prior Publication Data

US 2023/0262859 A1 Aug. 17, 2023

Related U.S. Application Data

(60) Provisional application No. 63/310,084, filed on Feb. 14, 2022.

(51) Int. Cl.
*H05B 45/34* (2020.01)
*H02M 1/00* (2006.01)
*H03M 1/12* (2006.01)

(52) U.S. Cl.
CPC .......... *H05B 45/34* (2020.01); *H02M 1/0025* (2021.05); *H03M 1/1245* (2013.01)

(58) Field of Classification Search
None
See application file for complete search history.

(56) References Cited

U.S. PATENT DOCUMENTS

| | | | |
|---|---|---|---|
| 8,760,075 B1* | 6/2014 | Tischler | H05B 45/382 315/307 |
| 2015/0208469 A1* | 7/2015 | Coetzee | H02M 1/36 315/307 |
| 2015/0326117 A1* | 11/2015 | Tischler | H05B 45/3725 315/185 R |
| 2021/0251066 A1* | 8/2021 | Bonne | H05B 45/10 |
| 2022/0130878 A1* | 4/2022 | Söll | H01L 27/14612 |

* cited by examiner

*Primary Examiner* — Wilson Lee
(74) *Attorney, Agent, or Firm* — NKL Law; Allen Xue

(57) ABSTRACT

An LED system includes an LED array, a plurality of driver circuits, a power supply, a bus and a feedback circuit. Each of the plurality of driver circuits is connected to and driving one of a plurality of LED subarrays in the LED array. Each of the plurality of driver circuits includes a comparator circuit, a local voltage register, and a global voltage register. The comparator circuit determines, as a local minimum voltage, a lowest voltage in the corresponding LED subarray. The global minimum voltage is determined by comparing all the local minimum voltages. The feedback circuit provides the power supply with a feedback signal reflecting the global minimum voltage and causes the power supply to adjust the voltage output to the LED array.

18 Claims, 8 Drawing Sheets

Section A

Section B

Section C

METHOD AND APPARATUS FOR POWER FEEDBACK LED VOLTAGE CONTROL

CROSS-REFERENCE TO RELATED APPLICATIONS

This application claims the benefit of priority under 35 U.S.C. § 119 to U.S. Provisional Application No. 63/310,084, filed on Feb. 14, 2022, and the entire contents of which are incorporated herein by reference.

BACKGROUND

1. Field of Technology

The present disclosure relates to an LED system, a liquid crystal display (LCD), as well as apparatus and method for controlling the voltage of LEDs in the LED system or the LCD system.

2. Description of Related Art

An LED system may include a plurality of LED subarrays, each of which includes a plurality of LEDs. The LED system also includes a plurality of driver circuits, each of which drives one of the plurality of LED subarrays. An example of such driver circuit is disclosed, for example, in U.S. Publication No. 2022/0043310 A1, and U.S. Publication No. 2022/0188254 A1.

When the number of the LEDs in the LED system becomes large, a conventional simple analog feedback cannot control power of all the LEDs efficiently due to a wide dynamic range for power supply. For example, the LED system may require many DC/DC converters if each LED driver needs to have one DC/DC converter in order to efficiently manage the power.

SUMMARY

This summary is provided to introduce a selection of concepts in a simplified form that are further described below in the detailed description. It is not intended to identify key features or essential features of the claimed subject matter, nor is it intended to be used as an aid in determining the scope of the claimed subject matter.

In one aspect of the current disclosure, an LED system contains an LED array comprising a plurality of LED subarrays, a plurality of driver circuits each connected to and driving one of the plurality of LED subarrays, and a power supply connected to and outputting a voltage to the LED array. Each of the plurality of driver circuits contains a comparator circuit for determining, as a local minimum voltage, a lowest voltage in the corresponding LED subarray connected thereto, a local voltage register for storing the local minimum voltage, and a global voltage register for storing, as a global minimum voltage, a lowest voltage among the plurality of local minimum voltages in the plurality of LED subarrays. The plurality of the driver circuits are connected through and communicate via a bus, which can be an inter-integrated circuit (I2C) bus. The LED system also contains a feedback circuit connected to the power supply and one or more of the global voltage registers in the plurality of driver circuits. The feedback circuit provides the power supply with a feedback signal reflecting the global minimum voltage and causes the power supply to adjust the voltage output to the LED array.

According to one embodiment, the comparator circuit has an analog-to-digital convertor (ADC) that samples one or more voltages from the corresponding LED subarray connected thereto, a memory connected to the ADC and stores the sampled voltages, a comparator loop that compares the voltages stored in the memory, determines the local minimum voltage, and outputs the local minimum voltage to the local voltage register.

According to another embodiment, the I2C bus is adapted to compare the local minimum voltages stored in the local voltage registers of the plurality of driver circuits and to determine the global minimum voltage, and wherein the global minimum voltage is stored in one of the plurality of global voltage registers in the plurality of driver circuits.

According to a further embodiment, the feedback circuit contains a digital-to-analog converter (DAC) that provides the power supply with an output for lowering the voltage to the LED array when the global minimum voltage is higher than a predetermined target voltage, and provides the power supply with an output for raising the voltage to the LED array when the global minimum voltage is lower than the predetermined target voltage.

In another embodiment, one of the plurality of driver circuits is connected to the feedback circuit and configured to output the minimum global voltage to the feedback circuit, and the remainder of the plurality of driver circuits are not connected to the feedback circuit.

According to still another embodiment, each of the plurality of driver circuits is connected to the feedback circuit and is configured to output the minimum global voltage to the feedback circuit.

In some embodiments the LEDs in the LED system are all signal color LEDs selected from white, red, blue, and green LEDs. Such an LED system may be used for backlighting an LCD display. Alternatively, the LED system may contain R, G, B LEDs and emits different colors. Such an LED system may be used for an LED display.

The present disclosure also provides a liquid crystal display (LCD), which includes an LCD panel and the LED system for backlighting the LCD panel. In addition, the disclosure provides an LED display that includes the LED system.

According to another aspect of the present disclosure, a method for controlling voltage supplied to an LED system having a plurality of LED subarrays includes the steps of applying an initial voltage to each of the plurality of LED subarrays in the LED system; determining a local minimum voltage for each of the plurality of LED subarrays to obtain a plurality of local minimum voltages; determining a global minimum voltage amongst the plurality of local minimum voltages; adjusting the initial voltage using the global minimum voltage as a feedback to obtain an updated voltage to be applied to the plurality of LED subarrays in the LED system.

According to one embodiment, the step of determining the local minimum voltage include sampling cathode voltages from each of the plurality of LED subarrays, and comparing the sampled cathode voltages to obtain the local minimum voltage.

According to another embodiment, the step of determining the global minimum voltage is carried out using an inter-integrated circuit (I2C) bus connected to a plurality of driver circuits each driving one of the plurality of LED subarrays. In this embodiment, the method may further include steps of designating one driver circuit among the plurality of driver circuits as a master on the I2C bus and the remainder of the plurality of driver circuits as slaves on the I2C bus; comparing a local minimum voltage in the master with local minimum voltages in the slaves to determine a lowest voltage value; and storing the lowest voltage value, as the global minimum voltage, in the master.

According to one further embodiment, the master remains the same during the step of determining the global minimum voltage, and each comparison determines a lower voltage value being stored in the master until the lowest voltage value in all the plurality of driver circuits is determined and stored in the master.

According to still one more embodiment, during the step of determining the global minimum voltage, each comparison determines the driver circuit having a lower local voltage value as the master.

BRIEF DESCRIPTION OF THE DRAWINGS

The teachings of the present disclosure can be readily understood with reference to following detailed description in view of the accompanying drawings.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. For example, the word "connection" denotes an electrically conductive conduit and/or a wireless communication channel, while the word "connected" means electrically connected, signally connected, or both. Further, Isource refers to a current source while Isink refers to a current sink. "Scan" or "scan line" both refer to a scan line in the driver circuit.

The features described herein may be embodied in different forms and are not to be construed as being limited to the examples described herein. Rather, the examples described herein have been provided so that this disclosure will be thorough and complete, and will convey the full scope of the disclosure to one of ordinary skill in the art.

First Embodiment

Figure 1:
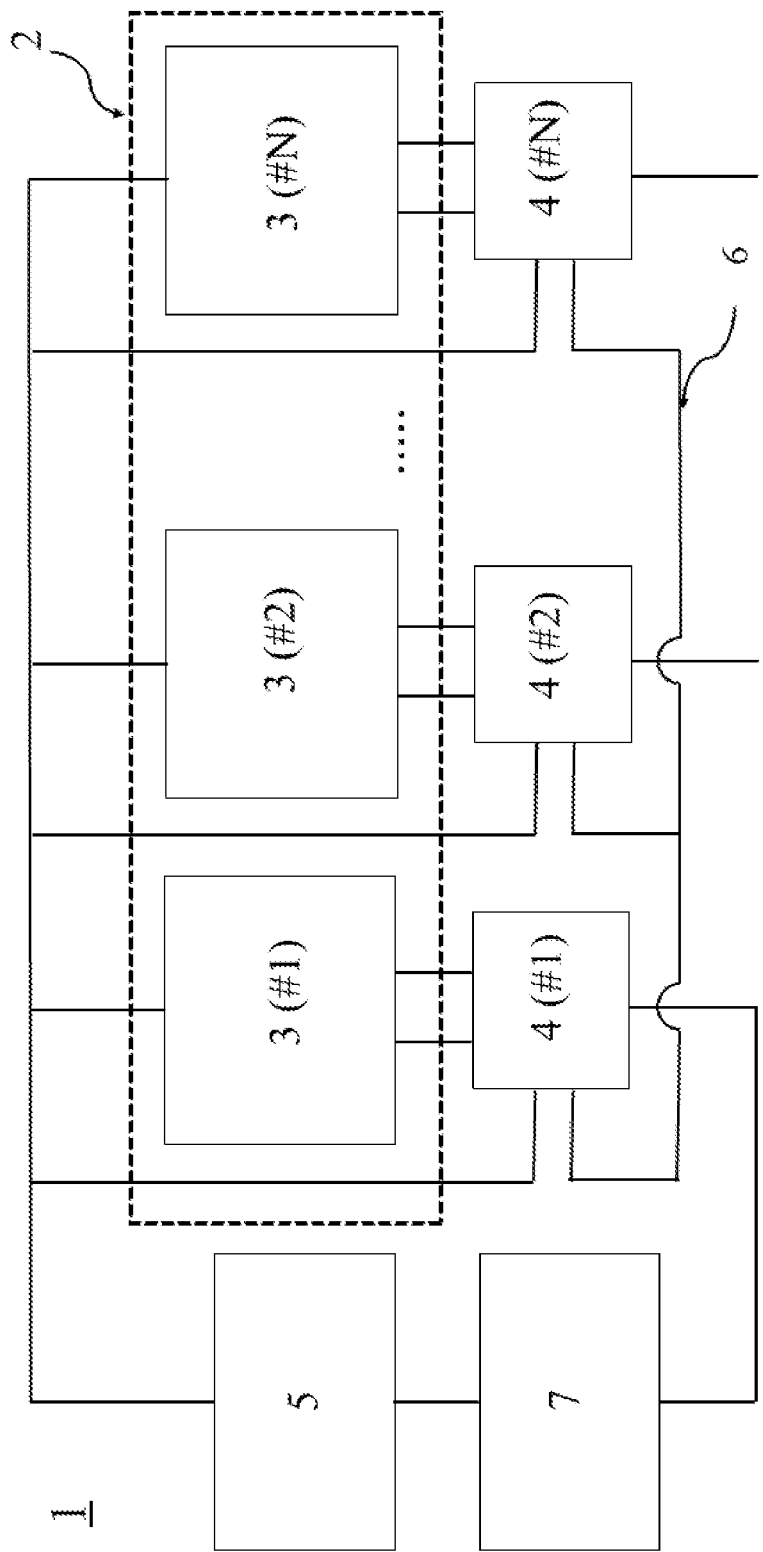
FIG. 1 illustrates a block diagram of an exemplary first embodiment of the present disclosure.
Figure 2:
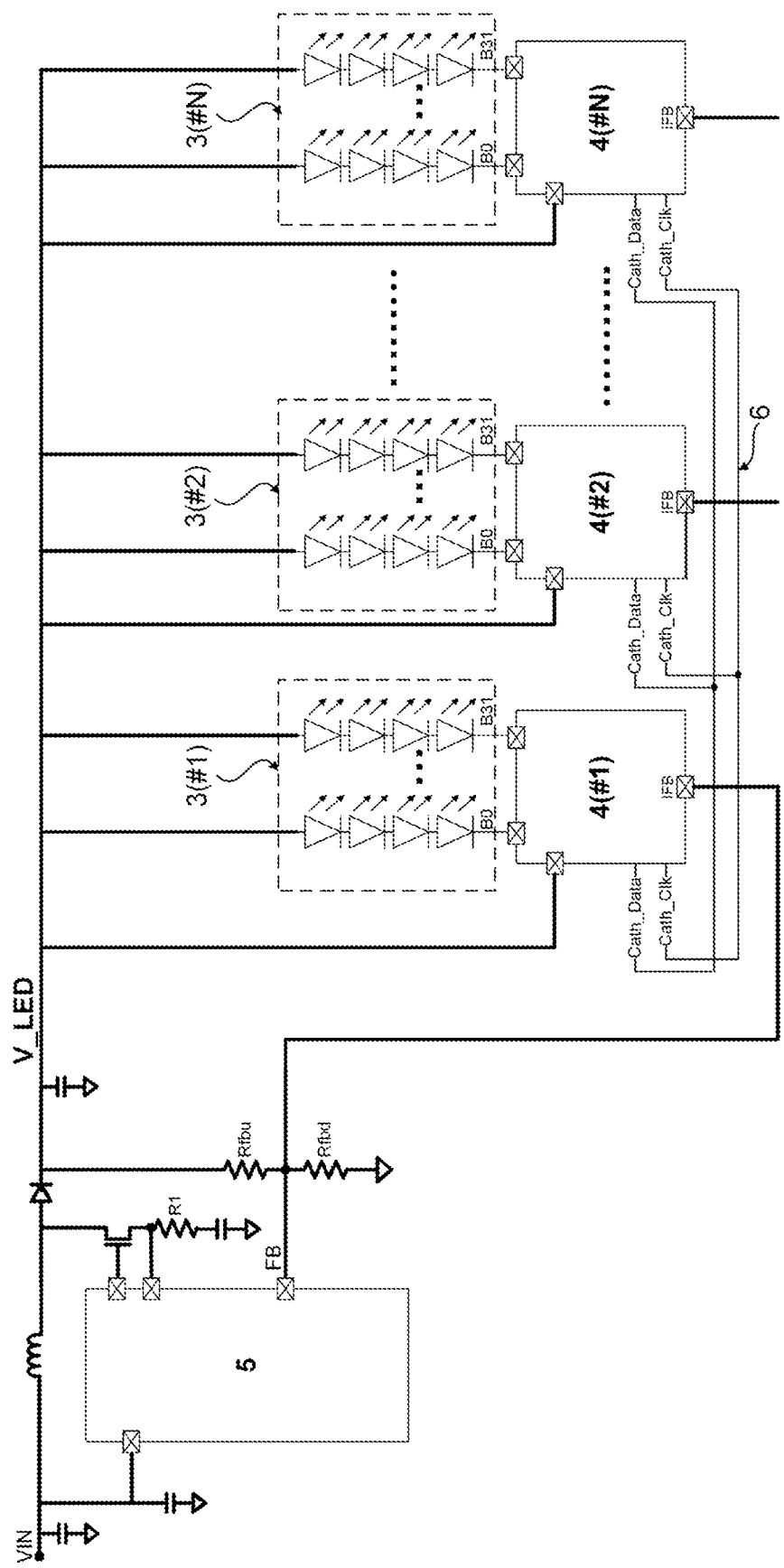
FIG. 2 illustrates a schematic circuit diagram of the first embodiment.

FIGS. 1, 2, 3, and 3A through 3C illustrate an exemplary first embodiment of the present disclosure. FIGS. 1 and 2 respectively illustrate a block diagram and a schematic circuit diagram of the first embodiment.

As shown in FIG. 1, an LED system 1 of the first embodiment includes an LED array 2. The LED array 2 includes a number of LED subarrays 3. Each of the LED subarrays 3 includes a plurality of LEDs. The LEDs can be in form of multiple serially connected LEDs or LED strings. The LEDs can be single color LEDs, e.g., R, G, B, or white LEDs. When the LED array is used for backlighting, the LEDs may all be white LEDs. In other embodiments, the LEDs in the LED array 2 may contain R, G, and B LEDs, so that the LED array 2 may be used in color LED displays.

In FIG. 1, the LED array 2 includes N number of LED subarrays 3. Here, N denotes an integer of 3 or more. Only #1, #2 and #N of the LED subarrays 3 are illustrated in FIGS. 1 and 2 for simplicity. The remaining LED subarray or subarrays, if any, are not illustrated.

The LED system 1 of the first embodiment includes driver circuits 4. Only #1, #2 and #N of the driver circuits 4 are illustrated in FIGS. 1 and 2. The remaining driver circuit or driver circuits, if any, are not illustrated. Each of the N driver circuits 4 is connected to one of the N LED subarrays 3 in such a manner that each of the N LED subarrays 3 is driven by one of the N driver circuits 4.

The LED system 1 of the first embodiment further includes a power supply 5, a bus 6, and a feedback circuit 7. The power supply 5 is connected to and outputs a voltage VLED to the LED array 2. An example of the power supply 5 is a DC/DC power module. The bus 6 connects #1 to #N driver circuits 4. An example of the bus 6 is an inter-integrated circuit (I2C). The I2C bus is a bi-directional bus that is easily implemented in any IC process and allows for simple inter-IC communication. Connections are minimized by using a serial data line (Cath_Data), a serial clock line (Cath_Clk) (as shown in FIG. 2) and a common ground to carry all communications.

The feedback circuit 7 is connected to the power supply 5. Though not explicitly shown in FIG. 2, the feedback circuit 7 takes signals from the driver circuits 4 as a feedback to the power supply 5 in FIG. 2 to adjust the output VLED (V_LED in the figures). The LED system 1 has a power feedback loop thus constructed therein.

In the first embodiment, one of the driver circuits 4 is connected to the feedback circuit 7, which is pre-designated as the driver circuit that stores the global minimum voltage and outputs it to the feedback circuit. The remainder of the driver circuits 4 is not connected to the feedback circuit 7, or "floating". In FIG. 1, only the driver circuit 4, which is denoted as "4 (#1)," is connected to the feedback circuit 7.

Figure 3:
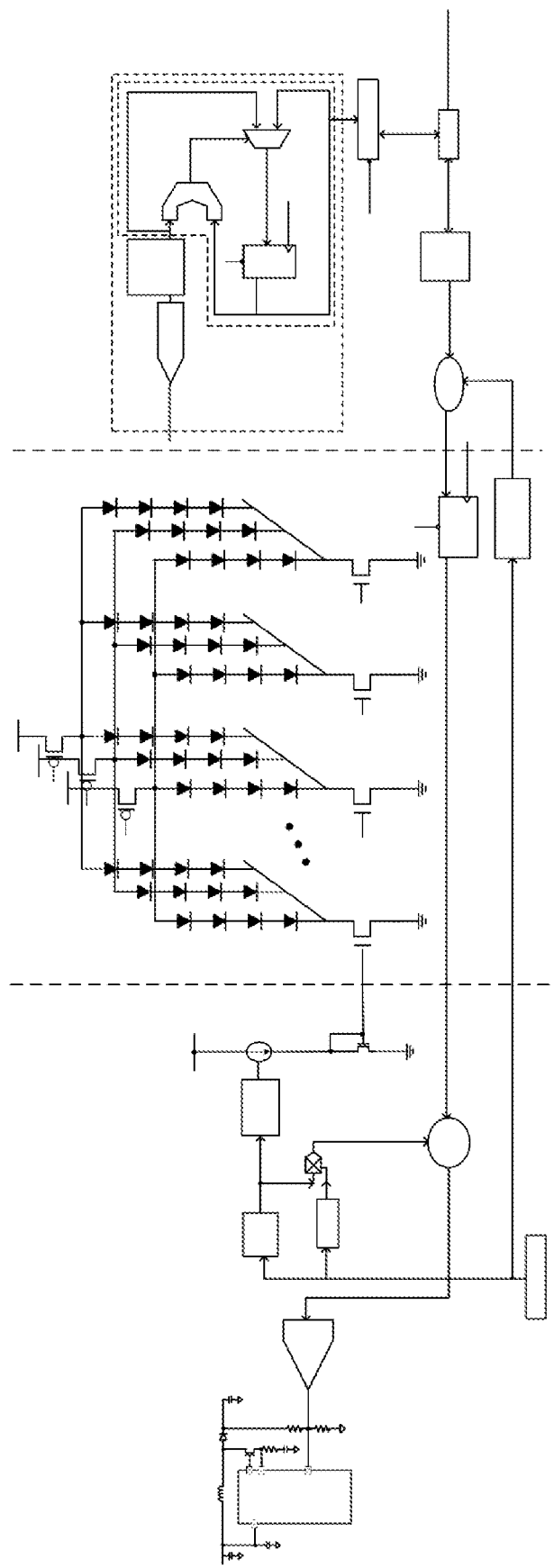
FIG. 3 illustrates another schematic circuit diagram of the first embodiment.
Figure 3A:
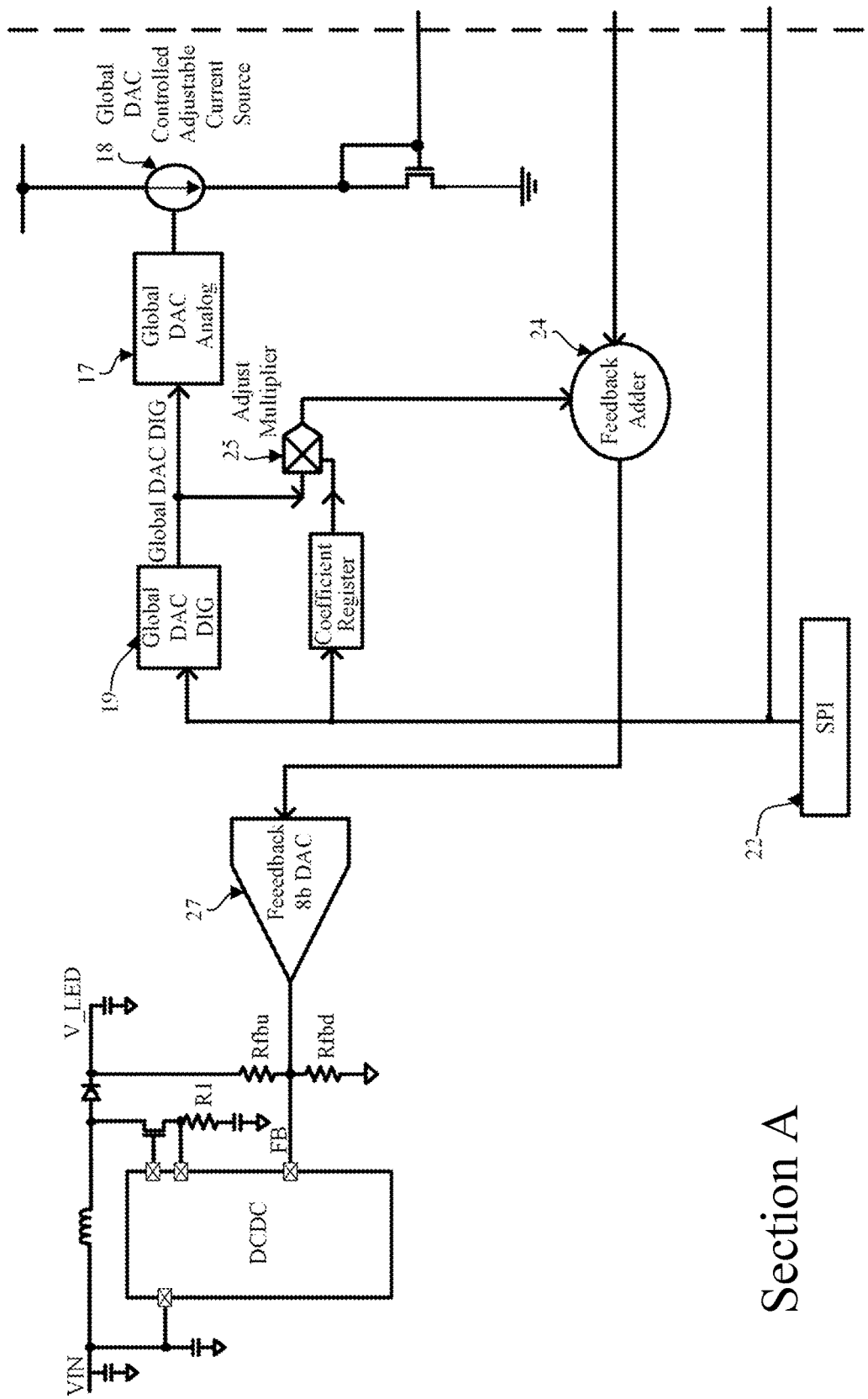
FIG. 3A illustrates Section A of the circuit diagram as illustrated in FIG. 3.
Figure 3B:
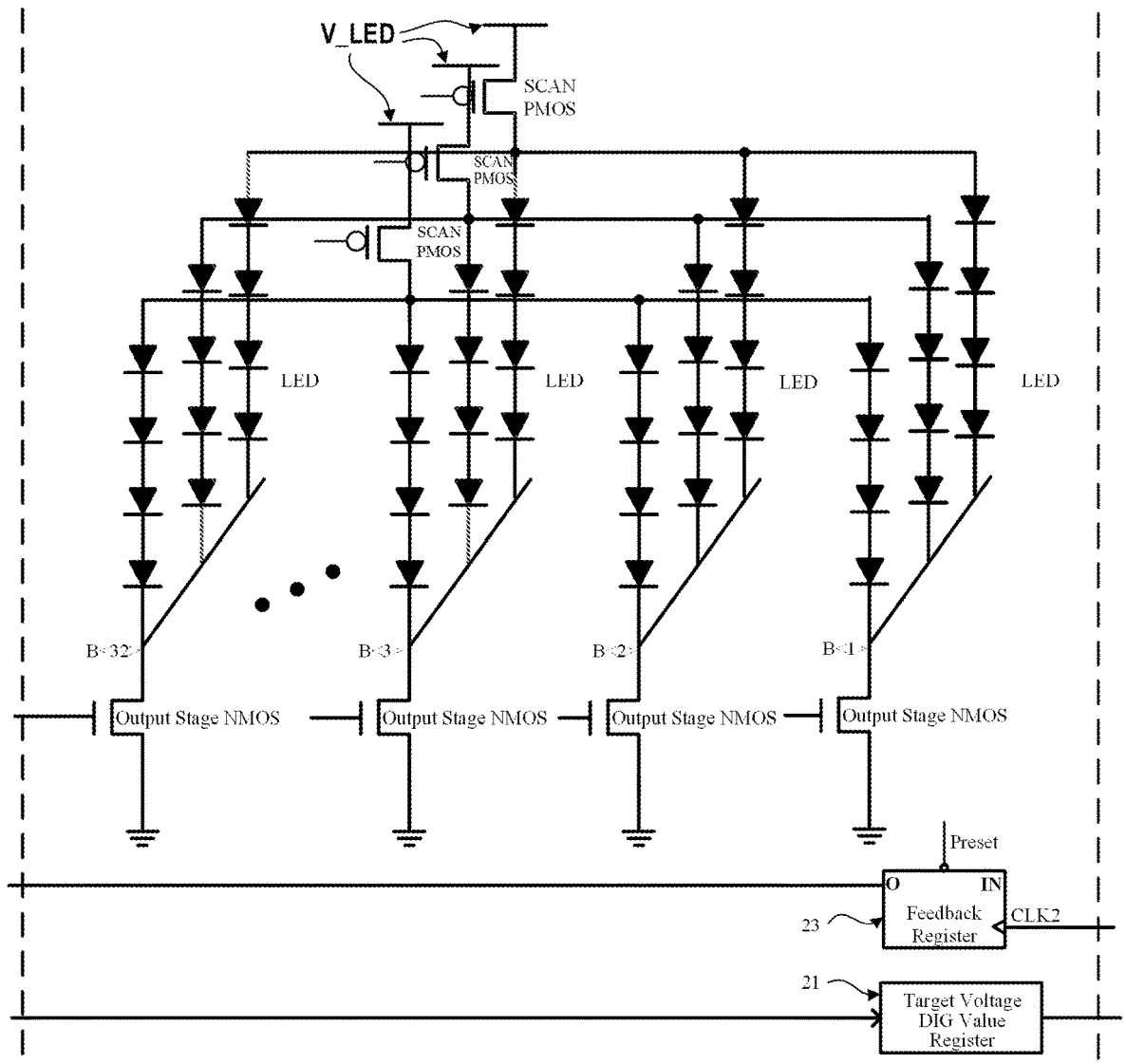
FIG. 3B illustrates Section B of the circuit diagram as illustrated in FIG. 3.
Figure 3C:
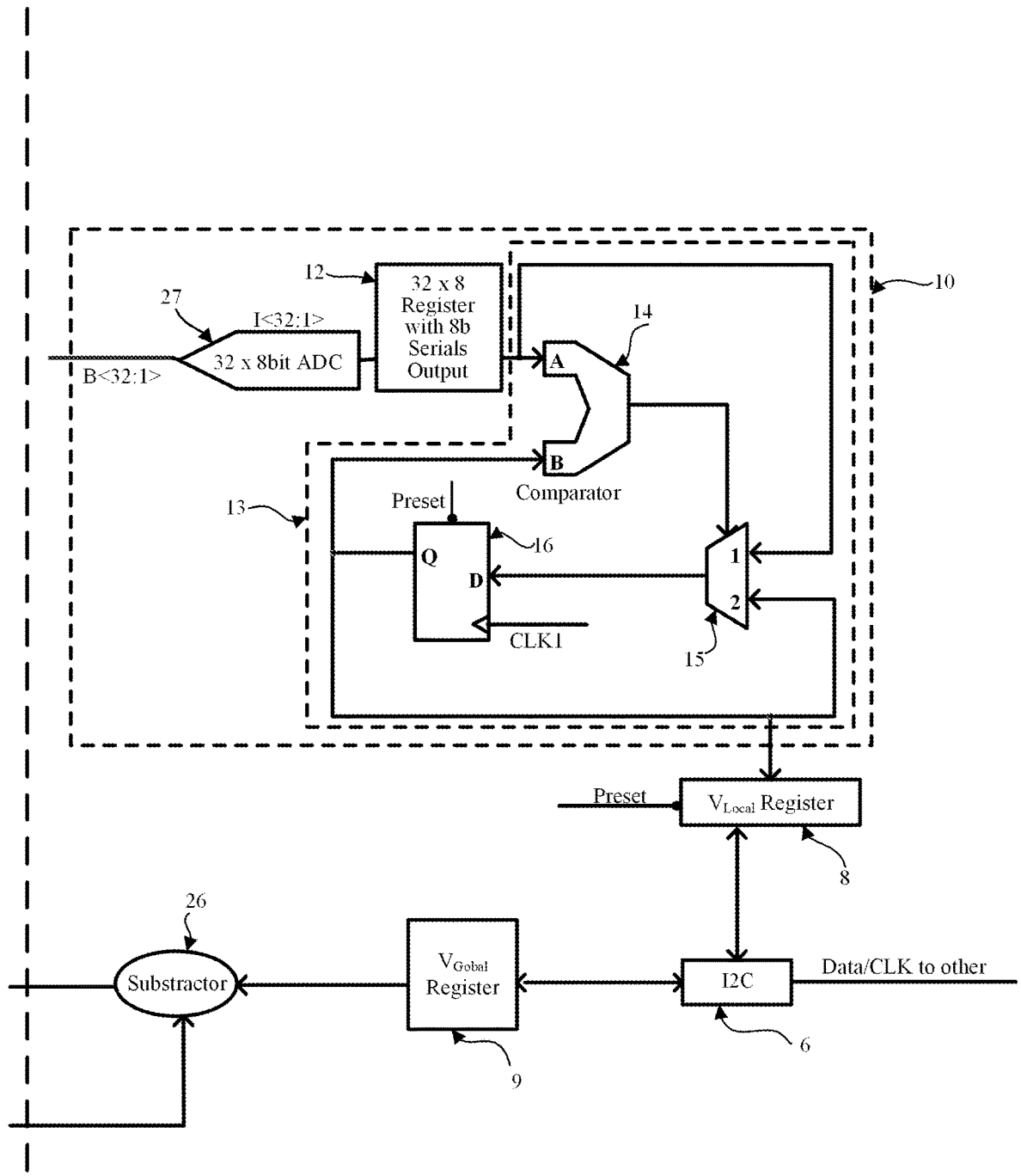
FIG. 3C illustrates Section C of the circuit diagram as illustrated in FIG. 3.

FIG. 3 illustrates a simplified circuit diagram of the first embodiment. For clarity, FIG. 3 shows only one LED subarray, relevant parts of the driver circuit 4, and relevant parts of the feedback circuit 7 associated with the LED subarray 3. FIGS. 3A through 3C respectively illustrate Section A, Section B and Section C in FIG. 3.

FIG. 3B shows the details of one exemplary LED subarray among the plurality of LED subarrays 3 in the LED system 1. The exemplary LED subarray includes three layers of LED strings. Each LED string has its anode connected to the drain node of a PMOS (i.e., SCANPMOS) and its cathode connected to the drain node of an output stage NMOS. Each LED layer has 32 LED strings parallelly connected to the drain node of a PMOS, while the source node of the PMOS is connected to the power supply 5 and receives VLED, as more clearly shown in FIG. 2.

The three layers of LEDs in the LED subarray are also connected in the manner that three LED strings from three different layers are connected to a drain node of an output stage NMOS, which has its source node connected to a current sink, e.g., ground. As there are 32 LED strings in each layer, there are correspondingly 32 output stage NMOS in the LED subarray. The output current from the LED strings (Isink).flows through each NMOS to ground.

In the exemplary embodiment of FIG. 3B, each LED string contains a group of four serially connected LEDs. Nevertheless, each LED string may contain only one LED or as many LEDs as the driver circuit can accommodate, as required by the specific application of the LED system. Further, the LEDs in all three LED layers can be of a same color, e.g., white color when the LED array is used for backlighting. Alternatively, the three layers of LED strings may be different color, e.g., the first layer, the second layer, and the third layers contains only R, G, B LEDs, respectively. In such an LED subarray, the layer of R LEDs, the layer of G LEDs, and the layer of B LEDs may each require a different VLED, which requires three different power supplies. Or, the layer of G LEDs and the layer of B LEDs may have the same VLED so that they may share one power supply.

FIG. 3C shows in detail a part of the driver circuit connected to the LED subarray. It contains a local voltage register 8, a global voltage register 9, and a comparator circuit 10. The comparator circuit 10 includes an analog-to-digital convertor (ADC) 11, a memory 12 connected to the ADC 11 and a comparator loop 13. The ADC 11 may be a 32-channel successive approximation register (SAR) ADC, which is connected to the drain nodes of all 32 NMOS in the LED subarray in FIG. 3B. The memory 12 may be a 32-x-8-bit register with an 8-bit serial output. An example of the comparator loop 13 includes a comparator 14, a multiplexer 15 and a shift register 16 in the first embodiment though the comparator loop 13 is not limited to this configuration.

In one exemplary method, when the LED array 2 is first powered on, the voltage VLED has a maximum value. VLED begins to fall for various causes including existence of an outside resistor R1. An output voltage of the power supply 5 eventually settles back to 1.25V after VLED becomes stable. Meanwhile, the ADC 11 samples cathode voltages of the LED strings in the corresponding LED subarray. The memory 12 stores the sampled voltages and then serially outputs the stored cathode voltages, e.g., by 8 bits. The comparator loop 13 compares the voltages stored in the memory 12, determines the lowest voltage in the corresponding LED subarray, and writes the determined voltage as a local minimum voltage in the local voltage register 8.

In the first embodiment, the comparator 14 receives an 8-bit output of the memory 12, which corresponds to a new value of the cathode voltage, and an 8-bit output of the shift register 16, which corresponds to a previous value of the cathode voltage, and outputs "1" if the former is smaller than the latter, and outputs "0" if the former is larger than the latter. The multiplexer 15 also receives the 8-bit output of the memory 12 and the 8-bit output of the shift register 16, as well as the output of the comparator 14 as a selection input, and outputs the 8-bit output of the memory 12 if the selection input is "1," and outputs the 8-bit output of the memory 12 if the selection input is "0." The shift register 16 receives the output of the multiplexer 15 and outputs at the same timing when a clock CLK 1 is received. The output of the shift register 16 is received in the comparator 14 and stored in the local voltage register 8. The local voltage register 8 thus stores the local minimum voltage of the corresponding LED subarray 3 in a cycle. As such, the local voltage register 8 of each of the driver circuits 4 stores the local minimum voltage of the corresponding LED subarray 3.

FIG. 3A and FIG. 3B detail part of the feedback circuit. Note that each driver circuit may contain the feedback circuit or the N number of driver circuits may share the same feedback circuit. In this embodiment, the feedback circuit contains a global digital-to-analog converter (DAC) 17, a current source 18, a global digital-to-analog converter (DAC) register 19, a coefficient register 20 and a target-voltage-digital-value register 21. These registers 19, 20, and 21 are controlled by a serial peripheral interface (SPI) 22 from a host (not shown in the figures). The feedback circuit further includes a feedback register 23, a feedback adder 24, and an adjust multiplier 25, and a min-to-target subtractor 26. The global DAC register 19 controls the global DAC 17 to adjustably control the current source 18 to supply current to the LED array.

The coefficient register 20 determines relationship between the global DAC register 19 and the feedback register 23. The target-voltage-digital-value register 21 stores one or more target minimum voltages at one or more corresponding output current levels. The global DAC register 19, the coefficient register 20, and the target-voltage-digital-value register 21 are connected to all the driver circuits 4 in the LED system 1. Consequently, each of the driver circuits 4 receives the same value from each of these three registers.

As illustrated in FIGS. 1 and 2, in the first embodiment, the driver circuit 4 (#1) is the only driver circuit connected to the feedback circuit 7. It is designated as a master on the I2C bus 6 to store a global minimum voltage and to implement a power feedback using the power feedback loop. The remainder of the driver circuits 4 are assigned as slaves and may not be connected to the feedback circuit 7.

Once the master driver circuit obtains the local minimum voltage in the local voltage register 8 in a cycle, it triggers the I2C bus 6 to summon the local voltage register 8 of each of the remainder of the driver circuits 4, compares the local minimum voltage of each of the remainder of the driver circuits 4 with its own, and determines the lowest voltage among the local minimum voltages as a global minimum voltage, stores it in the global voltage register 9. In this process, the global voltage register 9 reflects the new value in every cycle by identifying the local minimum voltage of each of the driver circuits 4 through the I2C bus 6.

Once the master driver circuit obtains the global minimum voltage, the feedback circuit 7 generates a feedback signal reflecting the global minimum voltage. The global voltage register 9 of the master driver circuit provides the min-to-target subtractor 26 with the global minimum voltage. The min-to-target subtractor 26 determines a feedback adjustment value based on the global minimum voltage and the target minimum voltage stored in the target-voltage-digital-value register 21, and has the feedback adjustment value stored in the feedback register 23. Specifically, when the global minimum voltage is higher than the target minimum voltage, which indicates that a threshold of the LED array 2 is lower than normal in the cycle and the voltage VLED is thus too high, the min-to-target subtractor 26 provides the feedback register 23 with a positive value so that the feedback adder 24 provides a feedback DAC 27, which is in the feedback circuit 7, with a higher input value for lowering the voltage VLED. In contrast, when the global minimum voltage is lower than the target minimum voltage, which indicates a threshold of the LED array 2 is higher than normal in the cycle and that the voltage VLED is thus too low, the min-to-target subtractor 26 provides the feedback register 23 with a negative value so that the feedback adder 24 provides the feedback DAC 27 with a lower input value for raising the voltage VLED.

The feedback register 23 provides the feedback adder 24 with the determined feedback adjustment value. The adjust multiplier 25 multiplies an output of the global DAC register 19 and an output of the coefficient register 20 together. The feedback adder 24 adds an output of the adjust multiplier 25 to the feedback adjustment value, and outputs an updated feedback adjustment value. The updated feedback adjustment value is fed to the feedback DAC 27. The feedback DAC 27 converts the updated feedback adjustment value into an analog feedback adjustment value, which is fed to the power supply 5.

In the process described above, the global voltage register 9 does not continuously follow the voltage VLED, but reflects the new value obtained after every cycle of finding a minimum voltage in all the driver circuits 4. On the other hand, the feedback DAC 27 quickly responses to the global DAC 17 and target voltage inputs. As soon as these values are modified, the feedback adder 24 changes its output to the feedback DAC 27, which adjusts the voltage VLED up or down accordingly.

In a variation of the first embodiment, only the pre-designated master driver circuit the LED system has a global minimum register while the slave driver circuits may not have the global minimum register.

Second Embodiment

Figure 4:
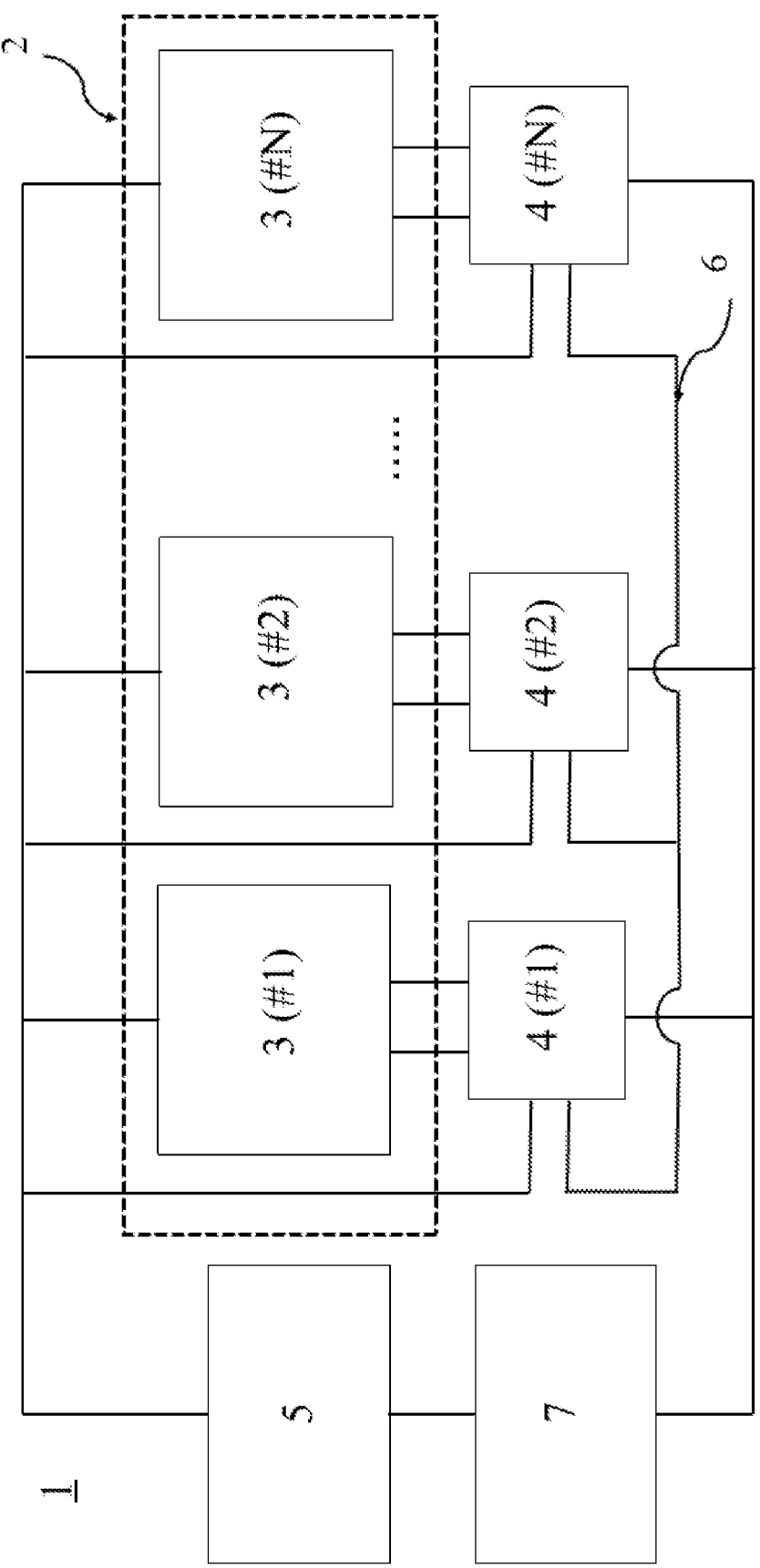
FIG. 4 illustrates a block diagram of an exemplary second embodiment of the present disclosure.
Figure 5:
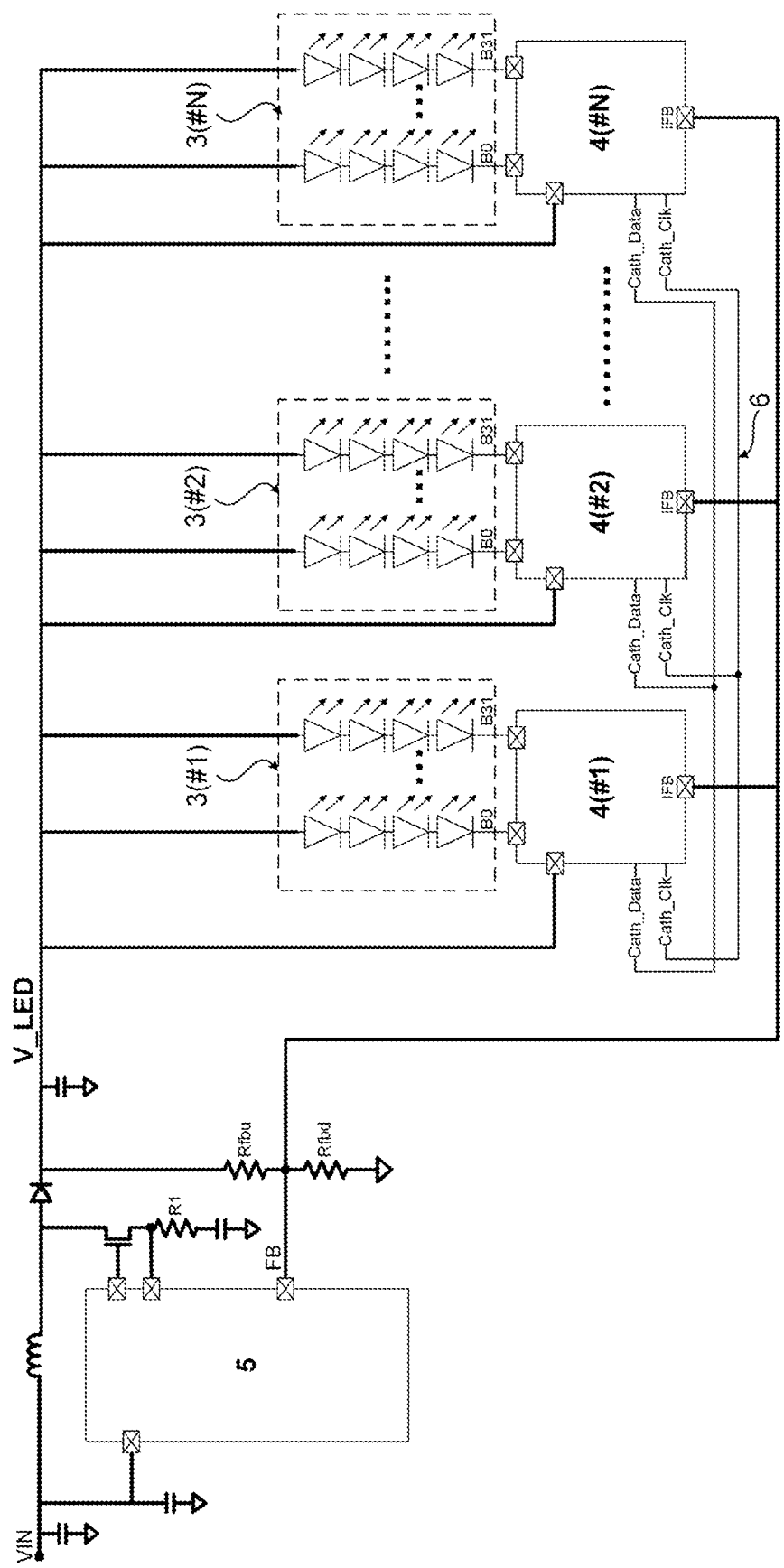
FIG. 5 illustrates a circuit diagram of the second embodiment.

FIGS. 4 and 5 illustrate an exemplary second embodiment of the present disclosure. FIGS. 4 and 5 respectively illustrate a block diagram and a part of the circuit diagram of the second embodiment. A same numeral in FIGS. 1-5 refers to the same device or component.

The second embodiment differs from the first embodiment in that each of the driver circuits 4 is connected to the feedback circuit 7 and can serve as the master. While the first embodiment pre-designates a specific driver circuit as the master. The configuration in the second embodiment enables any of the driver circuits 4 to serve as a master driver circuit, which triggers the bus 6 to summon the local voltage register 8 of each of the remainder of the driver circuits 4, compares the local minimum voltage of each of the remainder of the driver circuits 4 with its own, and determines the lowest voltage among the local minimum voltages as a global minimum voltage, which is stored in the global voltage register 9 of the master driver circuit.

During operation, while all the local voltage registers 8 of the driver circuits 4 are updated, the local minimum voltage stored in the local voltage register 8 of the driver circuit 4 (#1) is compared with the local minimum voltage stored in the local voltage register 8 of the driver circuit 4 (#2) through an operation of the I2C bus 6. One of the driver circuits 4 (#1 and #2), which stores a lower local minimum voltage in the local voltage register 8 than the other, is assigned as the master driver circuit temporarily, i.e., a "floating master," while the remainder of the driver circuits 4 are assigned as slaves and signally disconnected from the feedback circuit 7. The floating master driver circuit then continues to compare the local minimum voltage of another driver circuit 4 with its own. The floating master driver circuit is replaced with another driver circuit 4 if the comparison indicates that the other driver circuit 4 has a lower local minimum voltage in its local voltage register 8. In this case, the replacing floating master driver circuit is connected to the feedback circuit 7, and the replaced floating master driver circuit is signally disconnected from the feedback circuit 7.

Once the floating master driver circuit obtains the global minimum voltage, the feedback circuit 7 generates a feedback signal reflecting the global minimum voltage in the same manner as in the first embodiment.

The embodiments described herein are merely exemplary and are not intended to limit the scope of the present invention. Variations and modifications of methods, systems and apparatuses are possible and may be within the scope of the invention.

For example, the embodiments described herein can be implemented as a component of an LCD for backlighting the LCD. The embodiments described herein can be applied to a method for backlighting an LCD.

In other embodiments, the LED array can be part of RGB LED display panel. In this case, each LED subarray have R, G, and B LEDs and require one than one power supply.

Accordingly, the scope of protection is not limited by the embodiments described herein. Instead, the scope of protection is limited by the claims. The scope of the claims shall include all equivalents of the subject matter of the claims.

We claim:

1. An LED system, comprising:
an LED array comprising a plurality of LED subarrays,
a plurality of driver circuits, each connected to and driving one of the plurality of LED subarrays, wherein each of the plurality of driver circuits comprises a comparator circuit for determining, as a local minimum voltage, a lowest voltage in the corresponding LED subarray connected thereto, a local voltage register for storing the local minimum voltage, and a global voltage register for storing, as a global minimum voltage, a lowest voltage among the plurality of local minimum voltages in the plurality of LED subarrays;
a power supply connected to and outputting a voltage to the LED array;
a bus connecting the plurality of driver circuits; and
a feedback circuit connected to the power supply and one or more of the global voltage registers in the plurality of driver circuits, wherein the feedback circuit provides the power supply with a feedback signal reflecting the global minimum voltage and causes the power supply to adjust the voltage output to the LED array.

2. The LED system according to claim 1, wherein the comparator circuit comprises an analog-to-digital convertor (ADC) that samples one or more voltages from the corresponding LED subarray connected thereto, a memory connected to the ADC and stores the sampled voltages, a comparator loop that compares the voltages stored in the memory, determines the local minimum voltage, and outputs the local minimum voltage to the local voltage register.

3. The LED system according to claim 2, wherein the bus is an inter-integrated circuit (I2C), which is adapted to compare the local minimum voltages stored in the local voltage registers of the plurality of driver circuits and to determine the global minimum voltage, and wherein the global minimum voltage is stored in one of the plurality of global voltage registers in the plurality of driver circuits.

4. The LED system according to claim 1, wherein the feedback circuit comprises a digital-to-analog converter (DAC) that provides the power supply with an output for lowering the voltage to the LED array when the global minimum voltage is higher than a predetermined target voltage, and provides the power supply with an output for raising the voltage to the LED array when the global minimum voltage is lower than the predetermined target voltage.

5. The LED system according to claim 1, wherein one of the plurality of driver circuits is connected to the feedback circuit and configured to the minimum global voltage to the feedback circuit, and the remainder of the plurality of driver circuits are not connected to the feedback circuit.

6. The LED system according to claim 1, wherein each of the plurality of driver circuits is connected to the feedback circuit and is adapted to output the minimum global voltage to the feedback circuit.

7. The LED system according to claim 1, wherein all LEDs in each of the plurality of LED subarrays are single color LEDs selected from white, red, blue, and green LEDs.

8. The LED system according to claim 1, wherein each LED subarray comprises red, blue, and green LEDs.

9. The LED system according to claim 1, wherein each of the plurality of LED subarrays comprises a first plurality of LED strings that are parallelly connected to a first node, and the first node is connected to the voltage supply, and a second plurality of LED strings that are parallelly connected to a second node, and the second node is connected to a current sink, wherein each of the first plurality of LED strings and the second plurality of LED strings comprises a single LED or a plurality of serially connected LEDs.

10. The LED system of claim 8, wherein the first node is connected to one or more LED strings at an anode thereof, and the second node is connected to one or more LED strings at a cathode thereof.

11. A method for controlling voltage supplied to an LED system, wherein the LED system comprises a plurality of LED subarrays, the method comprising:

applying an initial voltage to each of the plurality of LED subarrays in the LED system;

determining a local minimum voltage for each of the plurality of LED subarrays to obtain a plurality of local minimum voltages; and determining a global minimum voltage amongst the plurality of local minimum voltages;

adjusting the initial voltage using the global minimum voltage as a feedback to obtain an updated voltage to be applied to the plurality of LED subarrays in the LED system.

12. The method of claim 10, wherein the step of determining the local minimum voltage comprises sampling cathode voltages from each of the plurality of LED subarrays, and comparing the sampled cathode voltages to obtain the local minimum voltage.

13. The method of claim 10, wherein the step of determining the global minimum voltage is carried out using an inter-integrated circuit (I2C) bus connected to a plurality of driver circuits each driving one of the plurality of LED subarrays.

14. The method of claim 13, further comprising:

designating one driver circuit among the plurality of driver circuits as a master on the I2C bus and the remainder of the plurality of driver circuits as slaves on the I2C bus;

comparing a local minimum voltage in the master with local minimum voltages in the slaves to determine a lowest voltage value; and storing the lowest voltage value, as the global minimum voltage, in the master.

15. The method of claim 14, wherein the master remains the same during the step of determining the global minimum voltage, and each comparison determines a lower voltage value being stored in the master until the lowest voltage value in all the plurality of driver circuits is determined and stored in the master.

16. The method of claim 14, wherein, during the step of determining the global minimum voltage, each comparison determines the driver circuit having a lower local voltage value as the master.

17. A liquid crystal display (LCD), comprising an LCD panel and the LED system of claim 1 for backlighting the LCD panel.

18. An LED display, comprising the LED system of claim 1.

* * * * *